(12) United States Patent
Abdulaziz et al.

(10) Patent No.: US 12,032,341 B2
(45) Date of Patent: Jul. 9, 2024

(54) TIME TO DIGITAL CONVERTER ARRANGEMENT WITH INCREASED DETECTION RANGE

(71) Applicant: Telefonaktiebolaget LM Ericsson (publ), Stockholm (SE)

(72) Inventors: Mohammed Abdulaziz, Lund (SE); Henrik Sjöland, Lund (SE); Tony Påhlsson, Lund (SE)

(73) Assignee: Telefonaktiebolaget LM Ericsson (Publ), Stockholm (SE)

( * ) Notice: Subject to any disclaimer, the term of this patent is extended or adjusted under 35 U.S.C. 154(b) by 0 days.

(21) Appl. No.: 18/459,719

(22) Filed: Sep. 1, 2023

(65) Prior Publication Data

US 2023/0418237 A1 Dec. 28, 2023

Related U.S. Application Data

(63) Continuation of application No. 17/920,298, filed as application No. PCT/EP2020/061444 on Apr. 24, 2020, now Pat. No. 11,774,915.

(51) Int. Cl.
  *G04F 10/00* (2006.01)
  *H03L 7/08* (2006.01)

(52) U.S. Cl.
  CPC ............. *G04F 10/005* (2013.01); *H03L 7/08* (2013.01)

(58) Field of Classification Search
  CPC .................................. G04F 10/005; H03L 7/08
  See application file for complete search history.

(56) References Cited

U.S. PATENT DOCUMENTS

| 9,432,025 B1* | 8/2016 | Khor ..................... H03L 7/0891 |
| 10,067,478 B1* | 9/2018 | Kolar Ranganathan ..................... H03K 5/159 |
| 10,263,625 B1* | 4/2019 | Tokairin ................ G04F 10/005 |

(Continued)

FOREIGN PATENT DOCUMENTS

| CN | 101640533 A | 2/2010 |
| CN | 110808735 B | 5/2020 |

(Continued)

OTHER PUBLICATIONS

International Search Report and Written Opinion dated Jan. 14, 2021 for International Application No. PCT/EP2020/061444 filed on Apr. 24, 2020, consisting of 10 pages.

(Continued)

*Primary Examiner* — Adam D Houston
(74) *Attorney, Agent, or Firm* — Weisberg I.P. Law, P.A.

(57) ABSTRACT

A Time to Digital Converter (TDC) arrangement includes a first delay circuit configured to receive a signal with N phases; a set of phase detectors configured to compare each phase of the signal with a reference signal; a logic circuit configured to receive output signals from the set of phase detectors and detect which phase signal that is the closest signal leading or lagging the reference signal; a first multiplexer configured to receive outputs from the first delay circuit and the logic circuit; a second delay circuit configured to delay the reference signal; a TDC configured to receive output signals from the first multiplexer and the second delay circuit; an adder configured to sum outputs from the logic circuit and the TDC and generate an output signal of the TDC arrangement.

20 Claims, 7 Drawing Sheets

(56) References Cited

U.S. PATENT DOCUMENTS

| | | | |
|---|---|---|---|
| 10,727,846 B2 * | 7/2020 | Janardhanan | H03L 7/087 |
| 10,976,709 B1 * | 4/2021 | Moore | G01T 1/248 |
| 11,067,954 B1 * | 7/2021 | Bhaumik | H03L 7/085 |
| 2008/0157839 A1 | 7/2008 | Staszewski et al. | |
| 2009/0256601 A1 * | 10/2009 | Zhang | H03L 7/085 |
| | | | 341/111 |
| 2010/0327912 A1 | 12/2010 | Chiu et al. | |
| 2011/0084741 A1 | 4/2011 | van de Beek | |
| 2011/0260902 A1 | 10/2011 | Lee et al. | |
| 2014/0333358 A1 * | 11/2014 | Kim | H03L 7/1974 |
| | | | 327/159 |
| 2016/0308541 A1 | 10/2016 | Liu et al. | |
| 2017/0205772 A1 * | 7/2017 | Burg | H03L 7/18 |
| 2017/0288686 A1 | 10/2017 | Gao | |
| 2018/0131380 A1 | 5/2018 | Mayer | |
| 2020/0192301 A1 * | 6/2020 | Khoury | H03L 7/085 |
| 2020/0195261 A1 * | 6/2020 | Khoury | H03B 5/1243 |
| 2023/0018398 A1 * | 1/2023 | Whitcombe | H03K 5/06 |
| 2023/0106659 A1 * | 4/2023 | Sakalabhaktula | H03L 7/081 |
| | | | 327/158 |

FOREIGN PATENT DOCUMENTS

| | | | | |
|---|---|---|---|---|
| CN | 110808735 B | * | 5/2020 | H03L 7/0991 |
| CN | 114640351 A | | 6/2022 | |
| CN | 114640351 A | * | 6/2022 | |
| CN | 115516768 A | * | 12/2022 | G04F 10/005 |
| CN | 115516768 A | | 12/2022 | |
| DE | 102009027495 A1 | | 2/2010 | |
| DE | 102009027495 A1 | * | 2/2010 | G01S 13/345 |
| EP | 3035536 A1 | * | 6/2016 | G04F 10/005 |
| EP | 3035536 A1 | | 6/2016 | |
| JP | 2010119077 A | * | 5/2010 | |
| JP | 2010119077 A | | 5/2010 | |
| JP | 2011259208 A | | 12/2011 | |
| JP | 2011259208 A | * | 12/2011 | |
| KR | 101278111 B1 | * | 6/2013 | |
| KR | 101278111 B1 | | 6/2013 | |
| KR | 20170083816 A | * | 7/2017 | |
| KR | 20170083816 A | | 7/2017 | |
| WO | 2021213668 A1 | | 10/2021 | |
| WO | WO-2021213668 A1 | * | 10/2021 | G04F 10/005 |

OTHER PUBLICATIONS

Liu, Hanli et al., A Sub-mW Fractional-N ADPLL With FOM of -246 dB for IoT Applications; IEEE Journal of Solid-State Circuits vol. 53, No. 12, Nov. 15, 2018, consisting of 13 pages.

Lu, Ping et al., A 3.6 mW, 90 nm CMOS Gated-Vernier Time-to-Digital Converter With an Equivalent Resolution of 3.2 ps; IEEE Journal Solid-State Circuits, vol. 47, No. 7, May 1, 2012, consisting of 10 pages.

Straayer, Matthew Z. et al., A Multi-Path Gated Ring Oscillator TDC With First-Order Noise Shaping; IEEE Journal of Solid-State Circuits, vol. 44, No. 4, Mar. 25, 2099, consisting of 10 pages.

Dudek, Piotr et al., A High- Resolution CMOS Time-to-Digital Converter Utilizing a Vernier Delay Line; IEEE Transactions on Solid-State Circuits, vol. 35, No. 2, Feb. 2000, consisting of 8 pages.

\* cited by examiner (a)

(b)

(c)

(d)

TIME TO DIGITAL CONVERTER ARRANGEMENT WITH INCREASED DETECTION RANGE

CROSS-REFERENCE TO RELATED APPLICATIONS

This application is a Continuation Application of U.S. application Ser. No. 17/920,298, filed Oct. 20, 2022 entitled "TIME TO DIGITAL CONVERTER ARRANGEMENT WITH INCREASED DETECTION RANG," which is a Submission Under 35 U.S.C. § 371 for U.S. National Stage Patent Application of International Application Number: PCT/EP2020/061444, filed Apr. 24, 2022 entitled "TIME TO DIGITAL CONVERTER ARRANGEMENT WITH INCREASED DETECTION RANGE," the entireties of both of which are incorporated herein by reference.

TECHNICAL FIELD

Embodiments herein relate to a Time to Digital Converter (TDC) arrangement. In particular, they relate to increasing a detection range of a subrange TDC in a digital Phase Locked Loop (PLL).

BACKGROUND

There is a need for accurate local oscillator (LO) signals in wireless transceivers. Typically, LO signals are generated using phase locked loops (PLLs). Traditionally analog PLLs have been used, but lately also digital ones. Digital phase locked loops (DPLLs) are becoming in performance equal to their analog counterparts thanks to complementary metal-oxide-semiconductor (CMOS) technology scaling. In a DPLL, a time to digital converter (TDC) is used to convert the phase difference between a reference signal (REF) and a variable clock output signal (CKV) from a digitally controlled oscillator (DCO) or from a frequency divider connected to the DCO into digital codes. The in-band phase noise of the DPLL is dependent on the resolution of the TDC, at the same time the TDC detection range must be increased with a margin to cover at least one clock cycle of the DCO signal. The TDC is implemented based on using a train of inverter stages to delay the variable clock output signal from the DCO by an inverter delay time $\Delta t_{inv}$ in each stage. The output of each inverter is latched by a flip-flop which is clocked by the reference signal REF. The requirements on TDC resolution and detection range lead to a trade-off between power and noise. A high resolution TDC needs a large number of delay cells, i.e. a longer delay line length, to satisfy the range requirement. Reducing the resolution results in increased in-band PLL phase noise. The in-band-phase noise of a DPLL is given by:

$$N_{TDC} = \left(\frac{4\pi^2}{12}\right) \cdot \frac{\Delta t_{inv}^2}{T_{CKV}^2} \cdot \frac{1}{F_{REF}}$$

Where $F_{REF}$ is the reference frequency and $T_{CKV}$ is the DCO output signal period. For example, if $F_{REF}$=500 MHz and $I_{CKV}$=125 pS, then in order to achieve −110 dBc/Hz in-band phase noise, $\Delta_{tinv}$ must be below 2.5 pS and the TDC needs at least 50 delay cells, plus a margin to cover for process spread. Such a small delay time requires high power consumption. Moreover, increasing the resolution to obtain less phase noise requires a higher number of delay cells. There is also a minimum delay time per stage for a given technology, and achieving higher resolution than that requires more complex and power consuming architectures. For examples, in P. Dudek, et. al, "A high-resolution CMOS time-to-digital converter utilizing a Vernier delay line", *IEEE Journal of Solid-State Circuits*, vol. 35, no. 2, February 2000, a Vernier delay line is used. In M. Z. Straayer and M. H. Perrott, "A Multi-Path Gated Ring Oscillator TDC With First-Order Noise Shaping," *IEEE Journal of Solid-State Circuits*, vol. 44, no. 4, April 2009, noise shaping is used by using delay lines in the form of ring oscillators. In P. Lu, A. Liscidini and P. Andreani, "A 3.6 mW, 90 nm CMOS Gated-Vernier Time-to-Digital Converter With an Equivalent Resolution of 3.2 ps", *IEEE Journal of Solid-State Circuits*, vol. 47, no. 7, July 2012, the two techniques, Vernier delay line and noise shaping, are combined by using a two-dimensional ring oscillator based delay line.

There is a fundamental trade-off between resolution, range and power consumption for a TDC. As the required resolution is finer than the shortest gate-delay of the semi-conductor technology chosen for implementation, the trade-off gets more severe, as more complex and power consuming architectures are then needed to implement a TDC. To reduce the power consumption, it would be favorable if the TDC detection range, i.e. the delay line length of the TDC, could be reduced. However, PLL operation typically requires a certain range of phase difference detection.

SUMMARY

Therefor it is an object of embodiments herein to provide a TDC arrangement with improved performance.

According to an aspect of embodiments herein, the object is achieved by a TDC arrangement. The TDC arrangement comprises a first delay circuit configured to receive a signal with N phases.

The TDC arrangement further comprises a set of phase detectors configured to compare each phase of the signal with a reference signal.

The TDC arrangement further comprises a logic circuit configured to receive output signals from the set of phase detectors and detect which phase signal that is the closest signal leading or lagging the reference signal.

The TDC arrangement further comprises a first multiplexer configured to receive outputs from the first delay circuit and the logic circuit.

The TDC arrangement further comprises a second delay circuit configured to delay the reference signal.

The TDC arrangement further comprises a TDC configured to receive output signals from the first multiplexer and the second delay circuit.

The TDC arrangement further comprises an adder configured to sum outputs from the logic circuit and the TDC and generate an output signal of the TDC arrangement.

According to an aspect of embodiments herein, the object is achieved by a method performed in a TDC arrangement. The TDC arrangement, compares each phase of a multiphase signal with a reference signal by a set of phase detectors, detects which phase signal that is the closest signal leading or lagging the reference signal by a logic circuit, delays the multiphase signal by a first delay circuit, selects by a first multiplexer a phase signal among the delayed multiphase signal based on output from the logic circuit, delays the reference signal by a second delay circuit, detects time difference by a TDC between the selected signal from the first multiplexer (260, 360) and the delayed reference signal and extends the detected time difference by summing in an adder outputs from the logic circuit and the TDC to generate an output signal of the TDC arrangement.

According to embodiments herein, it is proposed to choose the closest leading or lagging phase signal to the reference signal from the N-phase signal as input to the TDC. The required detection range of the TDC can then be reduced by a factor equal to the number of phases N while the TDC arrangement still covers the same range as if only one phase were utilized. That means the actual detection range of the TDC arrangement is increased by the number of phases N while a subrange TDC is used. The set of phase detectors is used to compare the multiphase signal with the reference signal and the logic circuit is used to detect the closest leading or lagging phase signal to the reference signal, and then control the first multiplexer to select the proper signal from the multiphase signal as input to the subrange TDC. To allow for the logic circuit to take a decision based on the outcome of the phase detection, before any flank reaches the subrange TDC, delays are inserted in the signal path between the TDC and the multiphase signal, and in the signal path between the TDC and the reference signal. These delays may be implemented utilizing simple structures with low power consumption.

Some advantages of the TDC arrangement according to embodiments herein are:
Reducing the required TDC detection range in a PLL by a factor of N, where N is the number of signal phases.
Low complexity, only one or two delay lines and a logic circuit are needed.
Reduced power consumption.
Range and resolution vs. power consumption trade-off is largely decoupled.
Mismatches between phases can be handled by calibration techniques.

Therefore, the embodiments herein provide an improved TDC arrangement with respect to detection range, power consumption, resolution and complexity.

BRIEF DESCRIPTION OF THE DRAWINGS

Examples of embodiments herein are described in more detail with reference to attached drawings in which.

DETAILED DESCRIPTION

Figure 1:
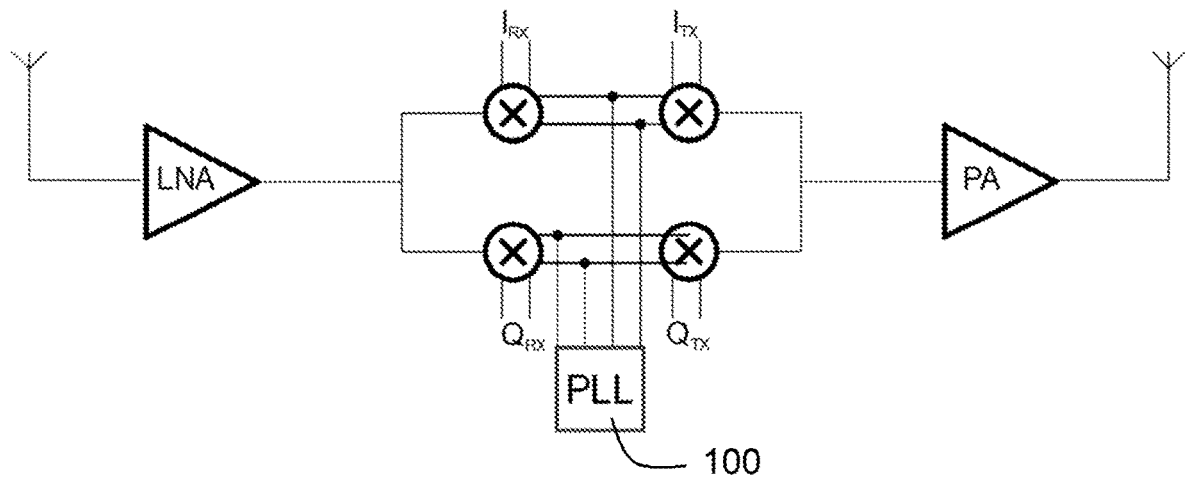
FIG. 1 is a schematic block view of a prior art homodyne transceiver with a PLL with quadrature (4 phases) output.

A typical homodyne transceiver with PLL 100 is shown in FIG. 1. In the example two separate antennas are shown, but the receiver and transmitter can also be connected to the same antenna by using an antenna switch for Time Division Duplex (TDD) or a duplex filter for Frequency Division Duplex (FDD) operation. Four phases $I_{RX}$, $Q_{RX}$, $I_{TX}$, $Q_{TX}$, from the quadrature local oscillator (LO), are needed to down-convert and up-convert radio signals to and from baseband signals in quadrature. Pre-scalers and/or poly phase filters are often used to generate different phases of the LO signal. More advanced architectures such as harmonic rejection transceivers need even more LO signal phases. Therefore, LO signal generation that support multiple phases are necessary for wireless applications. Moreover, multiple phase clock signals are also used in high data rate analog to digital converters (ADCs) where sub-ADCs are interleaved in time to achieve higher data rates. For high frequency LO signals, dividers are anyway needed to reduce the frequency for a TDC to operate in a reliable manner. Every time the LO signal is divided by two, two times the number of phases of the LO signal can be easily produced. For example, a frequency divide-by-four circuit can produce eight output phases with equal spacing. Since multiple phases of the LO signal can be produced with equal spacing and high precision, it is proposed to use this property to reduce the required TDC detection range in a PLL by a factor of N, where N is the number of available phases.

Figure 2:
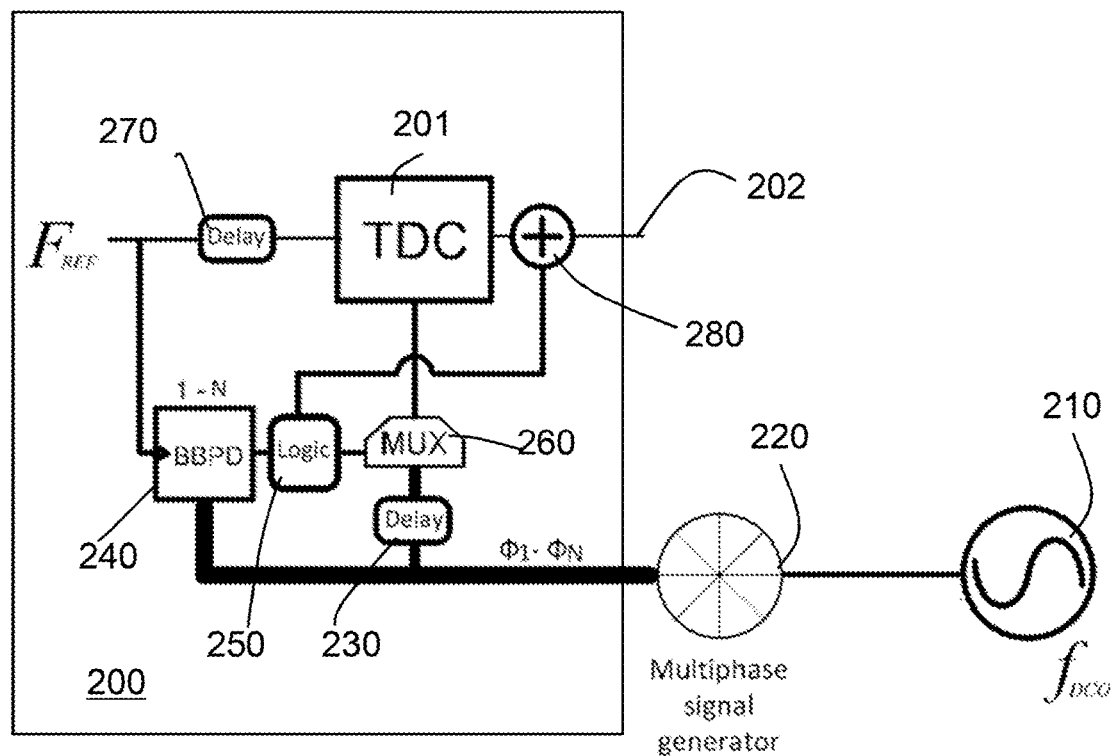
FIG. 2 is a schematic block view of a TDC arrangement according to embodiments herein.

FIG. 2 shows a TDC arrangement 200 according to embodiments herein. A DCO 210 and a multiphase signal generator 220 comprised in a PLL are also shown in FIG. 2. The TDC arrangement 200 comprises a TDC 201 and some other circuits described in the following to reduce the required detection range of the TDC 201 by a factor of N.

The TDC circuit 200 comprises a first delay circuit 230 configured to receive a signal with N phases. The signal with N phases may be received from the multiphase signal generator 220 connected to the DCO 210. The multiphase signal generator 220 may be a frequency divider, a polyphase filter or a phase interpolator. Alternatively, the signal with N phases may be received from a multiphase oscillator. For example, the DCO 210 may be a multiphase oscillator and the first delay circuit 230 may be connected directly to the DCO 210 and receive a signal with N phases generated from the DCO 210.

The TDC arrangement 200 further comprises a set of phase detectors 240 configured to compare each phase of the multiphase signal with a reference signal. The set of phase detectors 240 may be a set of bang-bang phase detectors (BBPDs) used to receive the reference signal and the signal with N phases and compare the phase of the reference signal $F_{REF}$ with each of the phases $\phi_1, \ldots \phi_N$.

The TDC arrangement 200 further comprises a logic circuit 250 configured to receive output signals from the set of phase detectors 240 and detect which phase that is the closest signal leading or lagging the reference signal. The logic circuit 250 may be implemented by simple logic gates to detect which of the phases that is closest leading or lagging to the reference signal. The logic circuit 250 has three functions: 1) detecting which phase that is closest signal leading or lagging the reference signal; 2) controlling the selection of a phase signal according to the phase detection; 3) calculating a compensation phase that needs to be added to the output of the TDC 201 depending on which phase that was detected to be the closest one.

The TDC arrangement 200 further comprises a first multiplexer MUX 260 configured to receive outputs from the first delay circuit 230 and the logic circuit 250. After detecting which of the phases that is closest leading or lagging to the reference signal, the logic circuit 250 controls the first multiplexer MUX 260 to select the corresponding signal phase and apply it to the input of the TDC 201.

To accommodate for the processing time of the logic gates and the multiplexer, two time delays are added to the TDC arrangement, one at the MUX 260 input, i.e. the first delay circuit 230, and one at the reference signal side. This will account for the time needed to take a decision on which phase signal to choose. Therefore, the TDC arrangement 200 further comprises a second delay circuit 270 configured to delay the reference signal.

The TDC 201 receives output signals from the first multiplexer MUX 260 and the second delay circuit 270. The first multiplexer MUX 260 lets the selected and delayed phase signal pass through and applies it to the TDC 201.

The TDC arrangement 200 further comprises an adder 280 configured to add or subtract outputs from the logic circuit 250 and the TDC 201 and generate an output signal 202 of the TDC arrangement 200. That is, the logic circuit 250 also calculates a coarse part of the phase difference, which depends on the chosen phase signal, and the adder 280 adds that to a fine part of the phase difference coming from the TDC 201, and this combined signal is the output 202 of the TDC arrangement 200. In this way, the TDC arrangement 200 still covers the same range as if only one phase were utilized with a reduced detection range of TDC 201. In other words, the TDC arrangement 300 has an increased detection range with a subrange TDC 201.

To be able to design the logic circuit 250, a truth table is first constructed. A DPLL with a quadrature signal, i.e. a signal with 4 phases 0°, 90°, 180°, 270° is investigated. The 4 signal phases 0°, 90°, 180°, 270° are input to the set of phase detectors BBPD1, BBPD2, BBPD3, BBPD4 respectively. The results are shown in Table 1.

| BBPD1 | BBPD2 | BBPD3 | BBPD4 | Closest leading phase (°) | Closest lagging phase (°) |
|---|---|---|---|---|---|
| 1 | 1 | 0 | 0 | 90 | 180 |
| 0 | 0 | 1 | 1 | 270 | 0 |
| 1 | 0 | 0 | 1 | 0 | 90 |
| 0 | 1 | 1 | 0 | 180 | 270 |

BBPDs produce either 1 or 0, where 1 means a signal phase leads the reference signal, while 0 means it lags. For example, in the first row, BBPD1 and BBPD2 both equal to 1 means that the reference signal is lagging the input signal phases to these phase detectors. 0 degree phase signal is input to BBPD1 and 90 degree phase signal is input to BBPD2. The reference signal is lagging both but the 90 degree phase signal is closer to the reference signal because this comes later in time. As can be seen in the table it is quite easy to detect which signal phase is closest to the reference signal. As can be seen the differential property of the even number of phases results in opposite signal polarities of BBPD1 and BBPD3, so that when the first is 1 the other is 0, and vice versa. The same goes for BBPD2 and BBPD4. It would in this case thus be sufficient to use just two BBPDs, for instance BBPD1 and BBPD2, as the other two provide redundant information.

Figure 3:
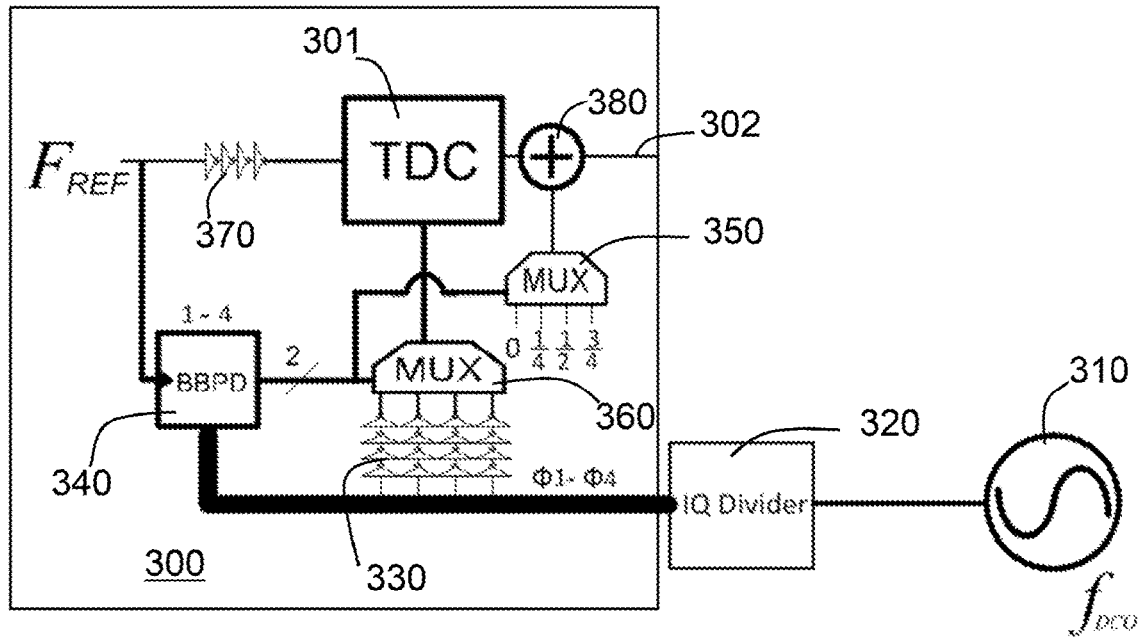
FIG. 3 is a schematic block view of an example TDC arrangement according to embodiments herein.

FIG. 3 shows an example of a TDC arrangement 300 according to embodiments herein using a signal with four phases to reduce the required TDC detection range by a factor of four. Due to the differential property of the signal phases, only two differential BBPDs 340 are needed. As in the TDC arrangement 200, the TDC arrangement 300 comprises a TDC 301, a first delay circuit 330, a second delay circuit 370, a first multiplexer 360, and an adder 380. The logic circuit 250 is here shown by a second multiplexer 350, which performs the function of the logic circuit 250. The second multiplexer 350 selects an addition number for the adder 380 according to the outputs of the phase detectors BBPDs 340. Let's assume a TDC that would cover the whole phase range of a complete DCO cycle would have an output range of 0-1. However, according to embodiments herein, the TDC 301 only covers one quarter of that range, i.e. 0-0.25. So it is needed to add a constant number, 0, ¼, ½, ¾ to the output of the TDC 301 depending on which phase that is fed to the TDC 301. For example, if the BBPDs output indicates that the phase 90° is the closest signal leading or lagging the reference signal, then the second multiplexer 350 selects ¼ to be added to the output of the TDC 301.

Figure 4:
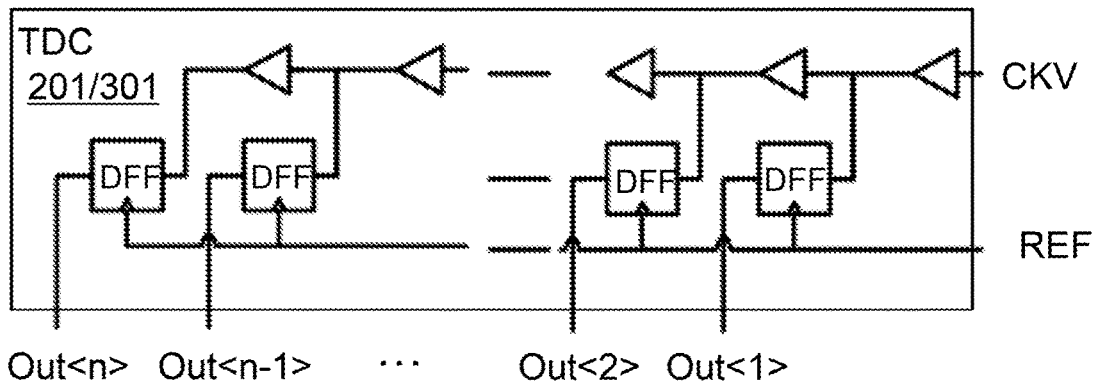
FIG. 4 is a schematic view of an example implementation of a TDC according to embodiments herein.

The TDC arrangement 300 has been implemented in a PLL with an IQ divide-by-two circuit 320 that generates a signal with four phases, using a TDC with one fourth of the otherwise required range, in a Fully Depleted Silicon On Insulator (FDSOI) CMOS process. The BBPD may be a D-flip-flop based on a sense amplifier followed by a Set-Reset (SR) latch. The rest of the logic circuit, delay circuits and multiplexer are implemented using plain CMOS logic gates. FIG. 4 shows an example implementation of the TDC 201/301 with delay lines.

The TDC arrangements 200, 300 according to embodiments herein are investigated by simulating the power consumption and phase noise. If it consumes too high current, then using a full range TDC would be beneficial. Since the TDC is limiting the in-band phase noise, noise performance of the proposed technique must also be evaluated. The reference frequency is chosen to 500 MHz, and the divided IQ signal is chosen to 8 GHz.

Figure 5:
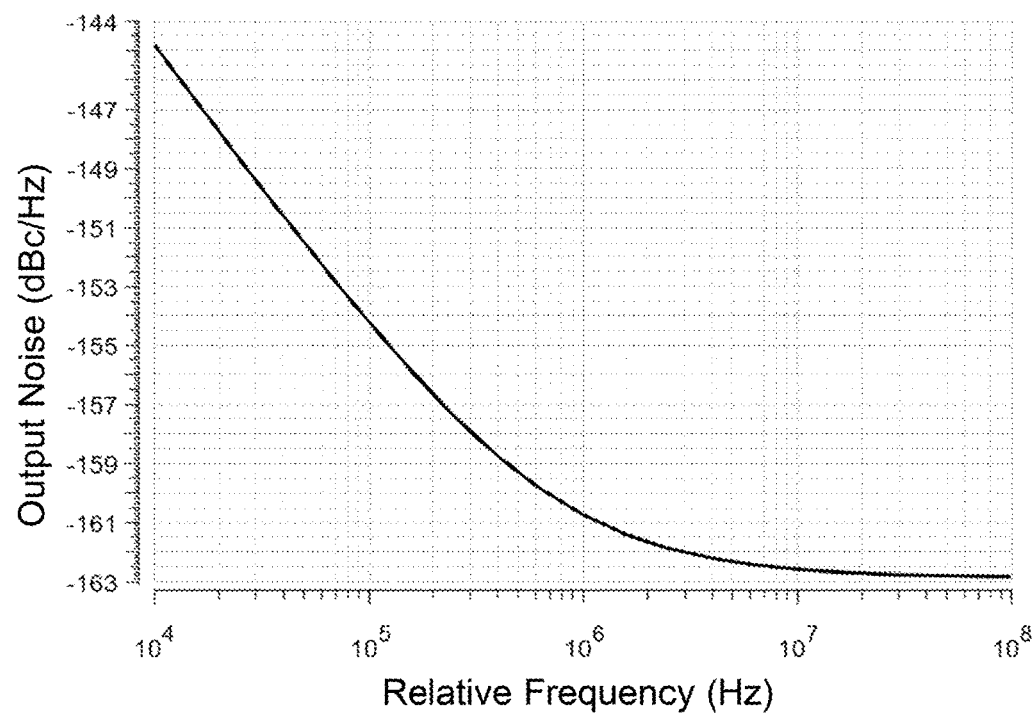
FIG. 5 is a diagram showing phase noise of a reference signal after passing a delay circuit.

The delay circuit on the reference signal, to compensate for the time needed to process the phases and decide on which phase signal to operate, has a simulated phase noise shown in FIG. 5. As can be seen the noise level is acceptable given that crystal-based reference signals have similar performance.

Figure 6:
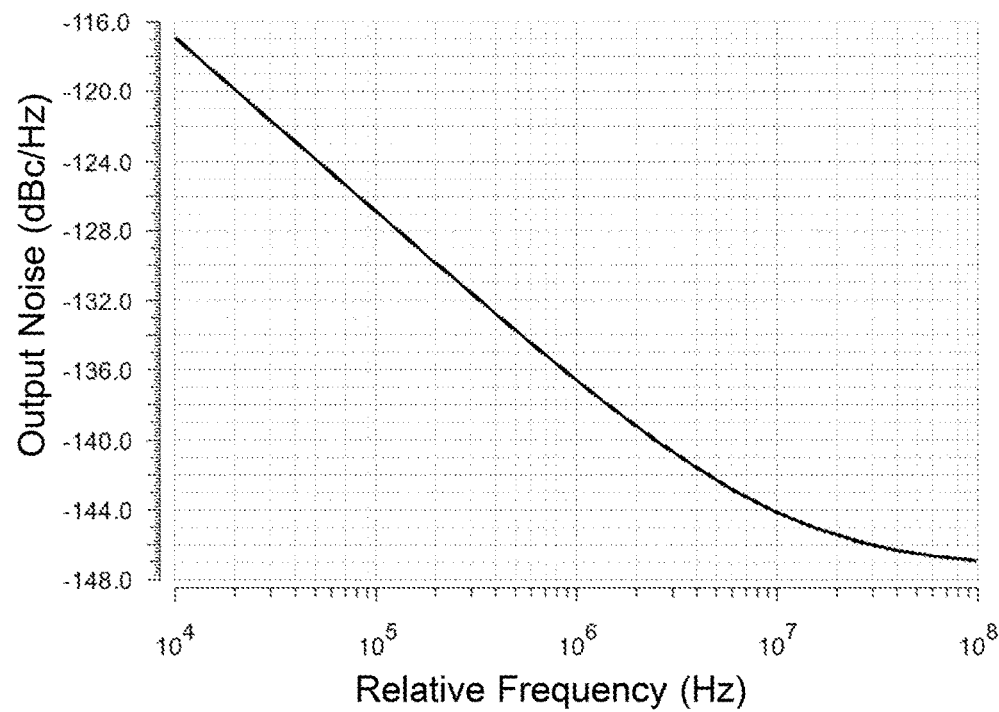
FIG. 6 is a diagram showing phase noise of an 8 GHz signal after passing through a delay circuit and a multiplexer.

The chosen signal phase at the MUX 260 output is also affected by the noise of the MUX 260 and the delay circuit 230. FIG. 6 shows simulated phase noise of the 8 GHz signal after it passes through the delay circuit 230 and the MUX 260. The phase noise at the MUX 260 output is −116 dBc/Hz, which is below the TDC 201/301 input referred noise contribution target of −110 dBc/Hz. The entire circuitry consumes only 0.45 mW from a 0.8 V supply. This is a very low power overhead, considering that the TDC 201/301 power consumption can be reduced by a factor of four in this case, from about 10 mW to 2.5 mW.

Figure 7:
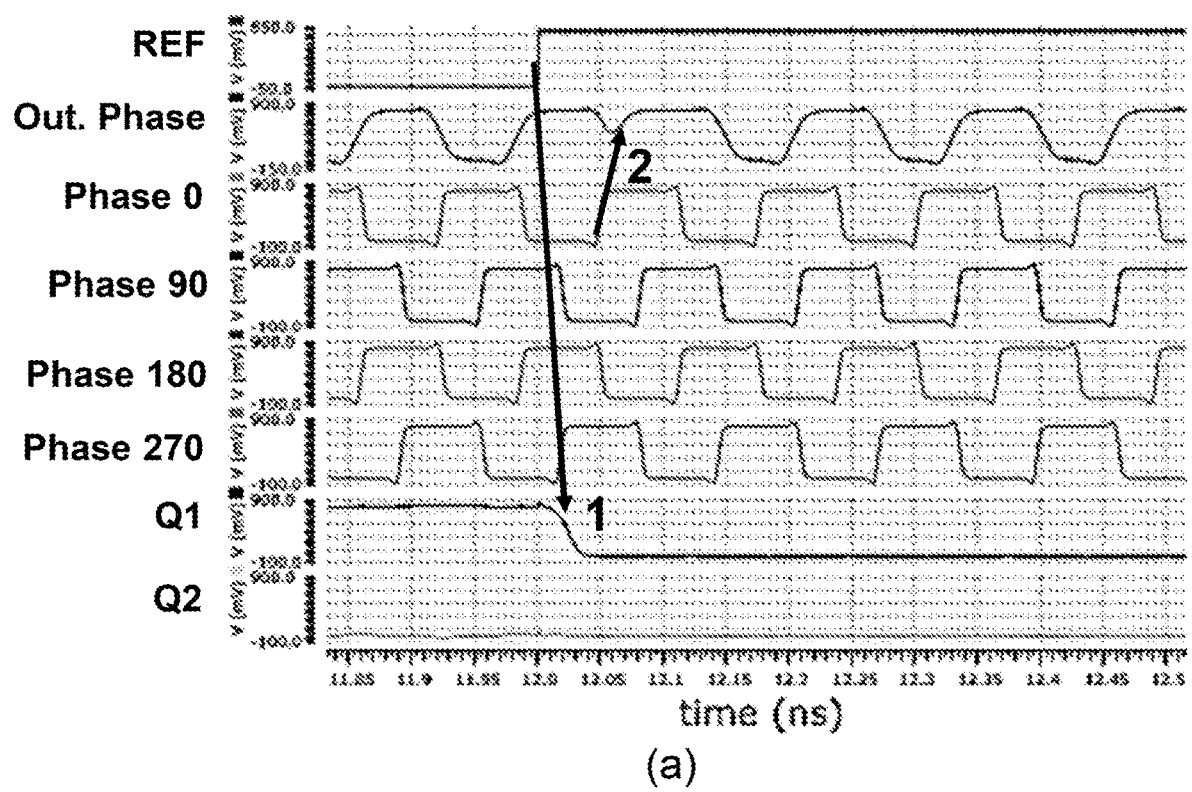
FIG. 7 (a) (b) (c) (d) are diagrams illustrating timing diagrams of phase detectors outputs and selected phases in the TDC arrangement according to embodiments herein.
Figure 7:
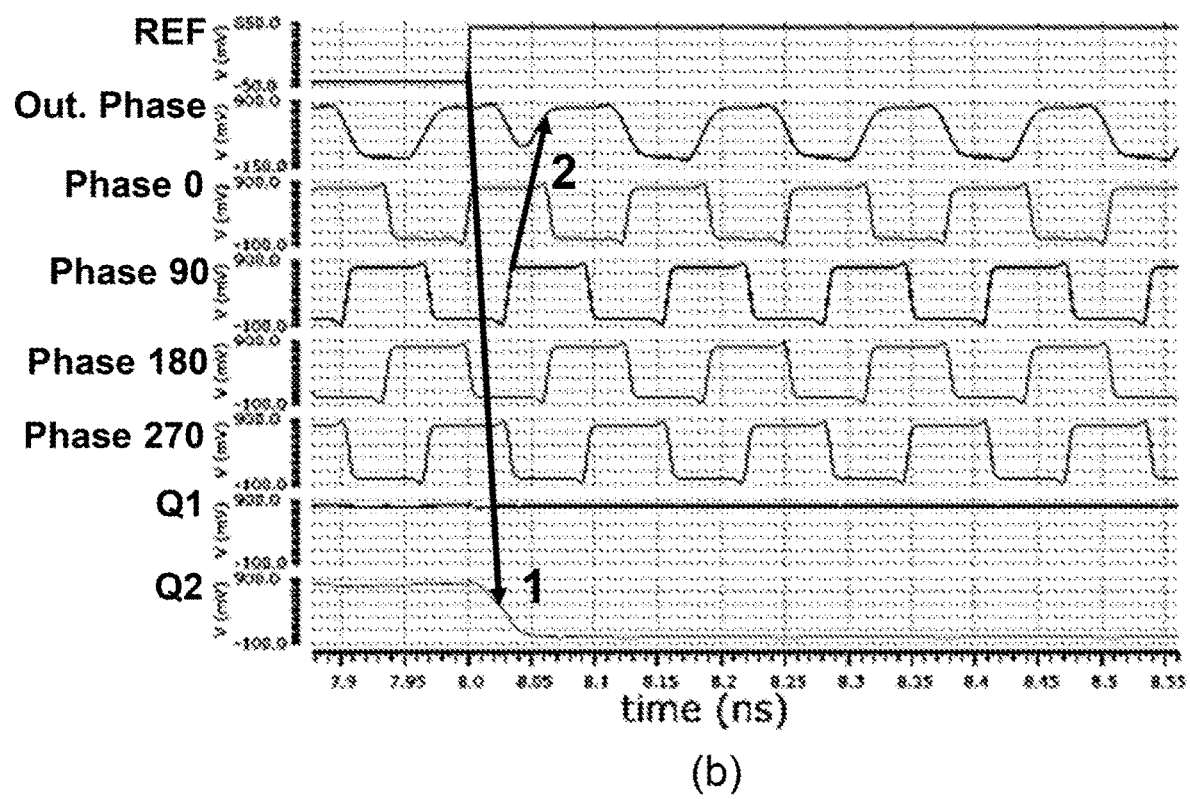
Figure 7:
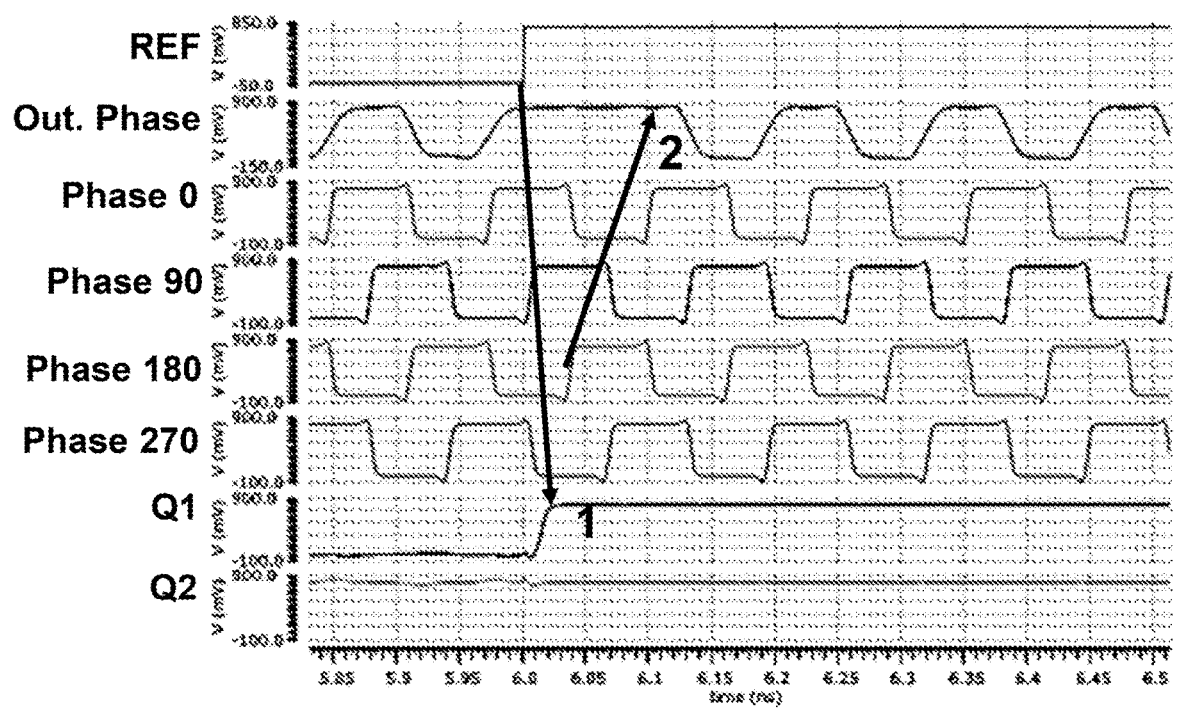
Figure 7:
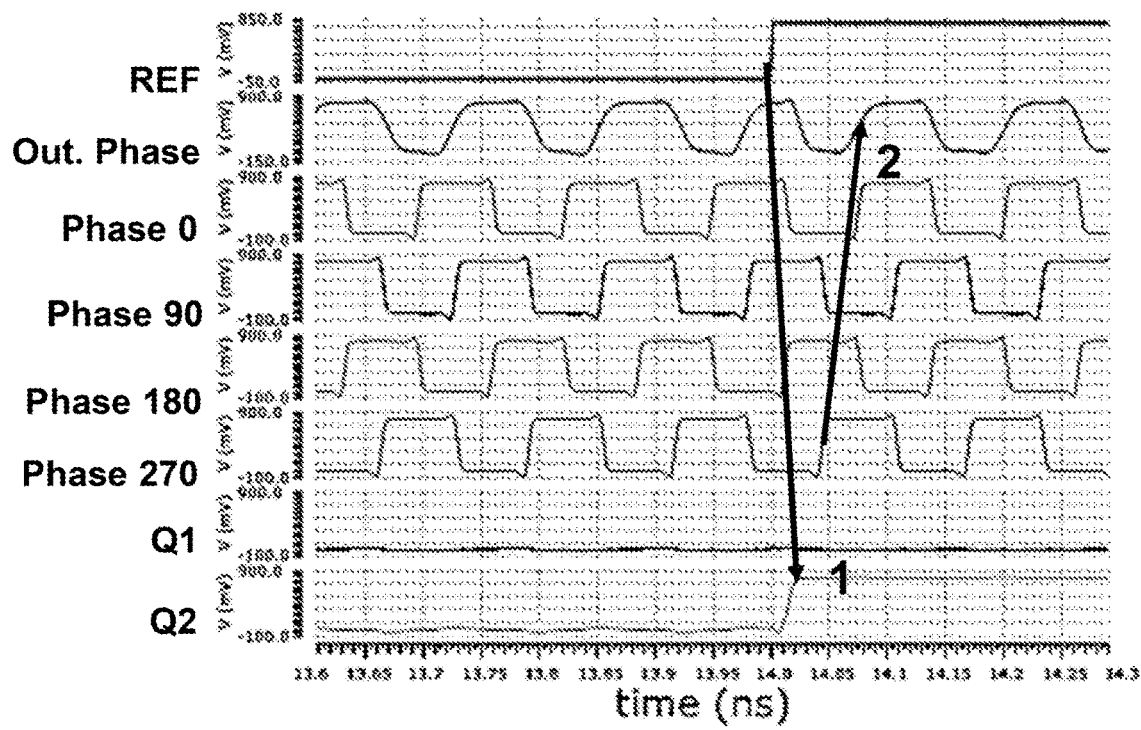

To check the logic functionality, the DCO frequency was changed from 8 GHz to 7900 MHz, to create phase drifting and possibility to verify that the phase signal selection works correctly. FIGS. 7 (a) (b) (c) (d) show timing diagrams of the reference signal indicated by REF, the outputs from the BBPD1 and BBPD2 indicated by Q1, Q2 respectively, the phase signals at the inputs of the BBPDs indicated by Phase 0, Phase 90, Phase 180 and Phase 270 and the selected signal phase after the first multiplexer MUX 260/360 indicated by Out. Phase. As shown in FIG. 7 (*a*), the arrow 1 indicates that when the reference signal flank comes, the state of the BBPD1 changes which means that BBPD1 detects the closest signal phase, in this case the closest lagging phase, which is the signal phase 0. However, the signal phase after the first MUX 260/360 is delayed compared to the corresponding signal phase at the input of the phase detector making it hard to see the connection between the detected phase and the selected phase in the Figure. So the arrow 2 indicates which signal phase is selected and fed to the TDC. In FIG. 7 (*b*), signal phase 90° is chosen, in FIG. 7 (*c*), signal phase 180° is chosen, and in FIG. 7 (*d*), signal phase 270° is chosen. So, the closest leading and the closest lagging phase to the reference signal rising edge is detected, the MUX 260 input is generated correctly based on the phase detection by the BBPDs, and the correct signal phase is selected through the MUX 260. The selected phase can be either the closest leading or the closest lagging phase. FIG. 7 shows an example where the closest lagging phase is chosen.

Figure 8:
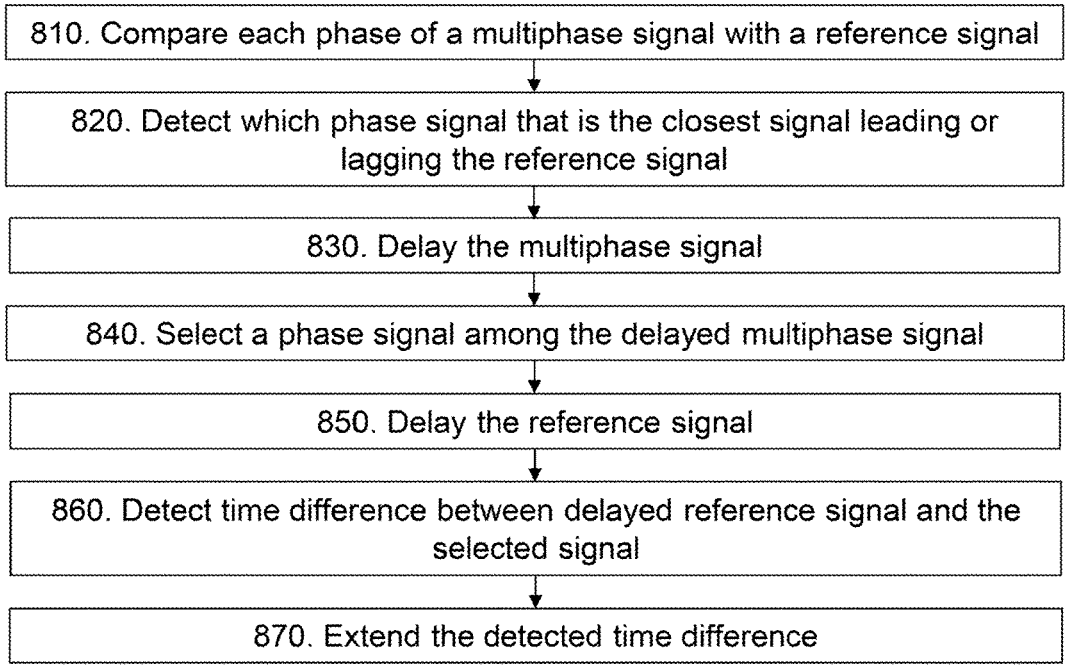
FIG. 8 is a flow chart of a method performed in a TDC arrangement according to embodiment herein.

A method performed in the TDC arrangement 200, 300 for increasing detection range will be described with reference to FIG. 8. The method comprises the following actions, which actions may be performed simultaneously or in any suitable order:

Action 810

The TDC arrangement 200, 300 compares each phase of a multiphase signal with a reference signal by the set of phase detectors 240, 340.

Action 820

The TDC arrangement 200, 300 detects which phase signal that is the closest signal leading or lagging the reference signal by the logic circuit 250, 350.

Action 830

The TDC arrangement 200, 300 delays the multiphase signal by the first delay circuit 230, 330.

Action 840

The TDC arrangement 200, 300 selects by the first multiplexer 260, 360 a phase signal among the delayed multiphase signal based on output from the logic circuit 250. The selected phase signal is the closest phase signal leading or lagging the reference signal and is input to the TDC 201, 301.

Action 850

The TDC arrangement 200, 300 delays the reference signal by the second delay circuit 270, 370. The delayed reference signal is input to the TDC 201, 301.

Action 860

The TDC arrangement 200, 300 detects time difference by the TDC 201, 301 between output signals from the first multiplexer 260, 360 and the second delay circuit 270, 370. That is the TDC 201, 301 detects the time difference between the delayed reference signal and the selected signal which is the closest phase signal leading or lagging the reference signal.

Action 870

The TDC arrangement (200, 300) extends the detected time difference by summing in the adder 280, 380 output from the logic circuit 250, 350, which depends on which phase of the multiphase signal that has been detected, and output from the TDC 201, 301 to generate an output signal 202, 302 of the TDC arrangement 200, 300. The logic circuit 250, 350 may select an addition number for the adder 380 according to the outputs of the phase detectors. The logic circuit 250, 350 may calculate a coarse part of the phase difference, which depends on the chosen phase signal, and adds that by the adder 280, 380 to a fine part of the phase difference coming from the TDC 201.

Figure 9:
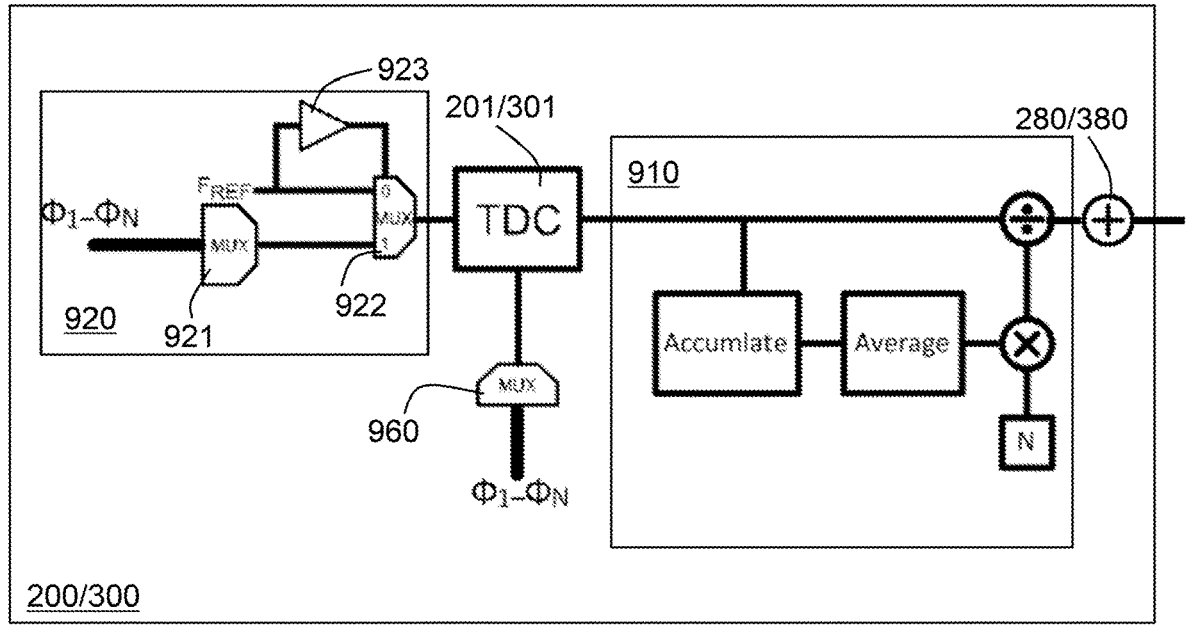
FIG. 9 is a schematic block diagram showing period estimation of a subrange TDC according to embodiment herein.

Reducing the required detection range of a TDC through the use of a multiple phase signal allows for easy period estimation of the CKV signal from DCO. The TDC gain is how much difference in the output value that a time difference at its inputs causes. If the period of the CKV signal is estimated in TDC output value, one gets a measure of the TDC gain. In a full range TDC, the period is fully captured and rising and falling flanks of a signal are easily found since the TDC output data sequence changes from series of ones to series of zeroes at the flanks. When dealing with reduced range TDCs, i.e. subrange TDCs, the period estimation may be acquired using two consecutive signal phases. The TDC output quantifies the time difference between the two consecutive signal phases, which corresponds to one $N_{th}$ of the period, it must therefore be multiplied by N to estimate the total period. FIG. 9 shows a block schematic for period estimation for a subrange TDC. Estimation of the period may be done after a pre-defined delay of the rising edge of the reference signal. The estimated TDC response for one full period is used to normalize the TDC gain, i.e. what phase difference a certain TDC output corresponds to. As shown in FIG. 9, the TDC arrangement 200, 300 further comprises a third multiplexer 920, which is shown by two multiplexers 921 and 922. The third multiplexer 920 is configured to receive the reference signal and the signal with N phases and outputs a selected signal to the TDC 201/301. The TDC arrangement 200, 300 further comprises a processing unit 910 to perform a method for period estimation of the TDC 201, 301. The first multiplexer 260/360 of the TDC arrangement 200/300 is shown as the multiplexer 960. The other circuits of the TDC arrangement 200/300, such as the first delay circuit 230/330, the second delay circuit 270/370, the logic circuit 250 and the second multiplexer 350 are not shown in FIG. 9.

The third multiplexer 920 receives the reference signal and the signal with N phases. The third multiplexer 920 is used to choose the reference signal or one of the multiphase signal to apply to the TDC 201/301. This is done by delaying the reference signal flank with a predefined delay time by a delay 923. The delay time is chosen to be long enough for the TDC 201/301 to run in normal mode and measure the phase difference between the selected signal phase coming from the first multiplexer 960 and the reference signal. So during this first time period, the reference signal goes into the TDC 201/301. And then after the pre-defined delay time, the delayed reference signal flank reaches MUX 922 and changes the select of MUX 922 so that the TDC 201/301 goes into the period estimation mode, i.e. instead of clocking the TDC 201/301 with the reference signal, the TDC 201/301 is now clocked with one of the signal phases from the multiphase signal. The multiplexer 921 is selected to forward a consecutive signal phase to the signal phase that is selected and forwarded in MUX 960. By doing this, two consecutive phase signals are input to the TDC 201/301 and the phase difference between the two consecutive phase signals can be measured.

When the reference signal goes to zero nothing happens until the reference signal has gone through the delay 923 and changes the select of MUX 922 and a new cycle can begin. By doing like this it is possible to do both the normal TDC operation, i.e. measuring phase difference between the selected signal phase and the reference signal, and the period estimation simultaneously.

Figure 10:
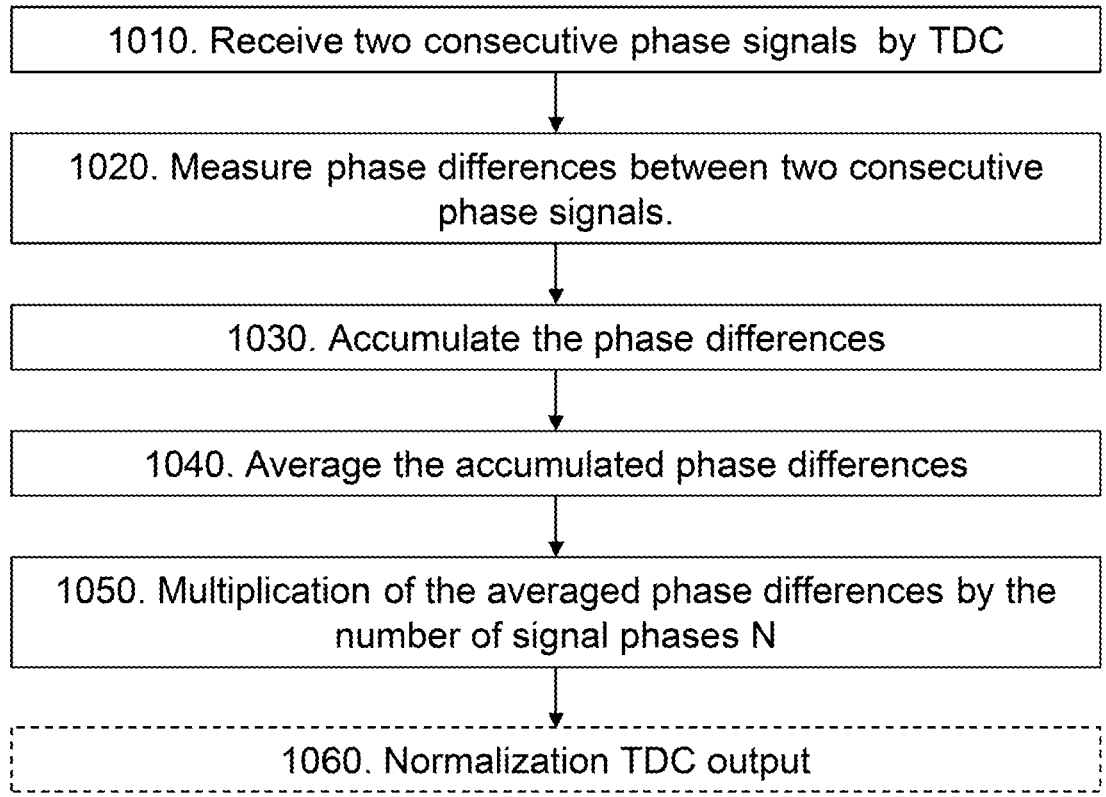
FIG. 10 is a flow chart of a method for period estimation of a subrange TDC according to embodiment herein.

A method for period estimation for a subrange TDC 201/301 comprised in the TDC arrangement 200, 300 will be described with reference to FIG. 10. The method comprises the following actions.

Action 1010

The TDC 201/301 receives two consecutive phase signals.

Action 1020

The TDC 201/301 measures the phase differences between the two consecutive phase signals.

Action 1030

The processing unit 910 accumulates the phase differences output from the TDC 201/301.

Action 1040

The processing unit 910 averages the accumulated phase differences to increase accuracy to get an estimated TDC 201/301 output corresponding to a part of DCO period.

Action 1050

When TDC output corresponding to a part of DCO period has been estimated, the processing unit 810 performs multiplication of the averaged phase differences by the number of signal phases N to estimate TDC output corresponding to the full DCO period.

Action 1060

The processing unit 910 may perform normalization of the TDC 201/301 output by the estimated TDC output for one DCO period by dividing the TDC 201/301 output by the estimated TDC output for one DCO period.

Assume an example where the output range of the TDC 201/301 is 0-1 and N=4, then TDC 201/301 only measures on a quarter of a full period which corresponds to the range 0-0.25 at the output of the TDC arrangement 200/300.

When doing the period estimation, the output values of the TDC 201/301 are accumulated, averaged and then multiplied by N=4. This gives a period value in the range of four times the TDC 201/301 output, i.e. 0-4.

When running in normal measure mode, the output of TDC 201/301 is still in the range of 0-1. If this output value is divided by the period estimation value, one has normalized the measured phase difference to the estimated period. And the output value from the normalized subrange TDC 201/301 is in the range 0-0.25, which is desired and then adding the extension value depending on which phase that is fed to the TDC 201/301 to get the full range 0-1 of the complete TDC arrangement 200/300.

To summarize, the TDC arrangements 200, 300 according to embodiments herein use simple logic that uses the already available DCO signal phases to scale down the required TDC range by a factor equal to the number of phases. The TDC arrangements 200, 300 are low complexity circuit, only one or two delay lines and a logic control circuit are needed. The TDC arrangements 200, 300 have improved performance with respect to range, power consumption and resolution.

Figure 11:
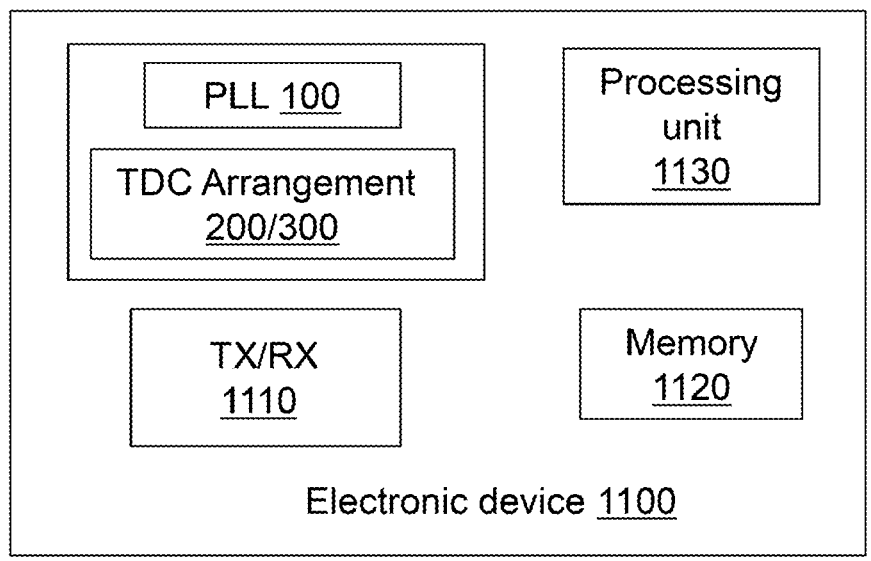
FIG. 11 is a block diagram illustrating an electronic device in which a TDC arrangement according to embodiments herein may be implemented.

The TDC arrangements 200, 300 according to embodiments herein may be implemented in a PLL circuit 100, and the PLL circuit 100 may be employed in various integrated circuits, electronic circuits, communication devices or apparatus. FIG. 11 shows a block diagram for an electronic device 1100 in which the TDC arrangements 200, 300 according to embodiments herein may be implemented. The electronic device 1100 comprises a PLL 100 in which the TDC arrangements 200, 300 according to embodiments herein may be implemented. The electronic device 1100 may comprise a receiver or a transmitter or both i.e. a transceiver TX/RX 1110. The electronic device 1100 may comprise other units, where a memory 1120, a processing unit 1130 are shown. The electronic device 1100 may be any one of a micro-processor, a radar, a base station, a wireless communication device such as a user equipment or a mobile device for a cellular communication system.

The word "comprise" or "comprising", when used herein, shall be interpreted as non-limiting, i.e. meaning "consist at least of".

The embodiments herein are not limited to the above described preferred embodiments. Various alternatives, modifications and equivalents may be used. Therefore, the above embodiments should not be taken as limiting the scope of the invention, which is defined by the appended claims.

The invention claimed is:

1. A Time to Digital Converter, TDC, arrangement comprising:
   a first delay circuit configured to:
   receive a signal with multiple phases; and
   output a delayed signal with corresponding multiple phases;
   a set of phase detectors configured to:
   compare each phase of the multiple phases of the signal with a reference signal;
   a first multiplexer configured to:
   receive the delayed signal; and
   output a selected one of the phases of the delayed signal in response to outputs from the set of phase detectors;
   a second delay circuit configured to:
   receive the reference signal; and
   output a delayed reference signal; and
   a TDC configured to:
   detect a time difference between the delayed reference signal and the selected one of the phases of the delayed signal.

2. The TDC arrangement of claim 1, wherein the set of phase detectors are Bang-Bang Phase Detectors, BBPDs.

3. The TDC arrangement of claim 1, wherein the signal with multiple phases is received from a multi-phase oscillator, a frequency divider, a poly-phase filter, or a phase interpolator connected to a digitally controlled oscillator, DCO.

4. The TDC arrangement of claim 1, wherein the selected one of the phases of the delayed signal corresponds to the phase of the signal that is closest leading the reference signal.

5. The TDC arrangement of claim 1, wherein the selected one of the phases of the delayed signal corresponds to the phase of the signal that is closest lagging the reference signal.

6. The TDC arrangement of claim 1, wherein a coarse part of an output of the TDC arrangement is based on the outputs from the set of phase detectors and a fine part of the output of the TDC arrangement is based on the time difference detected by the TDC.

7. The TDC arrangement of claim 6, wherein the TDC arrangement further includes an adder circuit configured to:
   generate the output of the TDC arrangement by adding the coarse part to the fine part.

8. The TDC arrangement of claim 1, wherein the TDC arrangement further includes:
   a third multiplexer configured to:
   receive the reference signal and a signal with the multiple phases; and
   output a selected phase signal; and a processing unit configured to:
  accumulate phase differences output from the TDC; and
  average the accumulated phase differences to estimate a TDC output corresponding to a part of a digitally controlled oscillator, DCO, period.

9. The TDC arrangement of claim 8, wherein the processing unit is further configured to one or both of:
  when TDC output corresponding to the part of the DCO period has been estimated, perform a multiplication of the averaged accumulated phase differences by a number of multiple phases to estimate the TDC output corresponding to a full DCO period;
  normalize the TDC output by the estimated TDC output for one DCO period.

10. The TDC arrangement of claim 1, wherein one or more of:
  the TDC arrangement is comprised in a Phase Locked Loop, PLL circuit;
  the PLL circuit is comprised in an electronic device;
  the electronic device is any one of a micro-processor, a radar, a base station and a wireless communication device for a cellular communication system.

11. A method in a Time to Digital Converter, TDC, arrangement, the TDC arrangement comprising a first delay circuit, a set of phase detectors, a first multiplexer, a second delay circuit, a TDC, the method comprising:
  receiving, at the first delay circuit, a signal with multiple phases;
  outputting, from the first delay circuit, a delayed signal with corresponding multiple phases;
  comparing, by set of phase detectors, each phase of the multiple phases of the signal with a reference signal;
  receiving, at the first multiplexer, the delayed signal;
  outputting, from the first multiplexer, a selected one of the phases of the delayed signal in response to outputs from the set of phase detectors;
  receiving, at the second delay circuit, the reference signal;
  outputting, from the second delay circuit, a delayed reference signal; and
  detecting, by the TDC, a time difference between the delayed reference signal and the selected one of the phases of the delayed signal.

12. The method of claim 11, wherein the set of phase detectors are Bang-Bang Phase Detectors, BBPDs.

13. The method of claim 11, wherein the signal with multiple phases is received from a multi-phase oscillator, a frequency divider, a poly-phase filter, or a phase interpolator connected to a digitally controlled oscillator, DCO.

14. The method of claim 11, wherein the selected one of the phases of the delayed signal corresponds to the phase of the signal that is closest leading the reference signal.

15. The method of claim 11, wherein the selected one of the phases of the delayed signal corresponds to the phase of the signal that is closest lagging the reference signal.

16. The method of claim 11, wherein a coarse part of an output of the TDC arrangement is based on the outputs from the set of phase detectors and a fine part of the output of the TDC arrangement is based on the time difference detected by the TDC.

17. The method of claim 16, wherein the TDC arrangement further includes an adder circuit, and the method further includes:
  generating, by the adder circuit, the output of the TDC arrangement by adding the coarse part to the fine part.

18. The method of claim 11, wherein the TDC arrangement further includes a third multiplexer and a processing unit, and the method further includes:
  receiving, at the third multiplexer, the reference signal and a signal with the multiple phases;
  outputting, from the third multiplexer, a selected phase signal;
  accumulating, by the processing unit, phase differences output from the TDC; and
  averaging, by the processing unit, the accumulated phase differences to estimate a TDC output corresponding to a part of a digitally controlled oscillator, DCO, period.

19. The method of claim 18, wherein the method further includes one or both of:
  when TDC output corresponding to the part of the DCO period has been estimated, performing, at the processing unit, a multiplication of the averaged accumulated phase differences by a number of multiple phases to estimate the TDC output corresponding to a full DCO period;
  normalizing, by the processing unit, the TDC output by the estimated TDC output for one DCO period.

20. A device comprising a Phase Locked Loop, PLL circuit, the PLL circuit comprising:
  a first delay circuit configured to:
    receive a signal with multiple phases; and
    output a delayed signal with corresponding multiple phases;
  a set of phase detectors configured to:
    compare each phase of the multiple phases of the signal with a reference signal;
  a first multiplexer configured to:
    receive the delayed signal; and
    output a selected one of the phases of the delayed signal in response to outputs from the set of phase detectors;
  a second delay circuit configured to:
    receive the reference signal; and
    output a delayed reference signal; and
  a TDC configured to:
    detect a time difference between the delayed reference signal and the selected one of the phases of the delayed signal.

* * * * *